United States Patent [19]

Delano

[11] Patent Number: 5,392,002
[45] Date of Patent: Feb. 21, 1995

[54] LOW VOLTAGE BIPOLAR NEGATIVE IMPEDANCE CONVERTER

[75] Inventor: Cary L. Delano, San Jose, Calif.

[73] Assignee: National Semiconductor Corporation, Santa Clara, Calif.

[21] Appl. No.: 69,219

[22] Filed: May 28, 1993

[51] Int. Cl.⁶ .......................................... H03F 3/45
[52] U.S. Cl. .................................. 330/252; 330/260; 330/311
[58] Field of Search ............... 330/61 A, 69, 252, 258, 330/260, 311; 333/216, 217

[56] References Cited

U.S. PATENT DOCUMENTS 3,445,780  5/1969  Beelitz .................................. 330/69

FOREIGN PATENT DOCUMENTS 4-245707  9/1992  Japan .................................. 330/252

OTHER PUBLICATIONS

"Digitally Programmable Continuous Time Linear Phase Lowpass Filter for Hard Disk Drives" Geert A. DeVeirmman, Richard G. Yamasak, Silicon Systems, Inc., Tustin, Calif.–Analog and Mixed Signal Design Conference, sponsored by Computer Design Magazine, held from Oct. 30, 1991 through Nov. 1, 1991 at the Santa Clara, Calif. Marriott Hotel.

IEEE Journal of Solid-State Circuits, Apr. 1991, by Shigetaka Takagi et al. "100-MHz Monolithic Low–Pass Filters with Transmission Zeros Using NIC Integrators".

IEEE Journal of Solid–State Circuits, vol. 27, No. 2, Feb. 1992, by Bram Nauta "A CMOS Transconductance-C Filter Technique for Very High Frequencies".

Paper 3-B.2, "CMOS Triode Transductor Continuous Time Filters" by John Pennock, Peter Frith, R. G. Barker, Wilson Microelectronics Ltd. (Reprinted from IEEE CICC, pp. 378-381, 1986).

Paper 3-B.5, "Design Considerations for High-Frequency Continuous-Time Filters and Implementation of an Antialiasing Filter for Digital Video" by Gopinathan, Tsividis, et al. (Reprinted from IEEE J. Solid-State Circuits, vol. SC-25, No. 6, pp. 1368-1378, Dec. 1990.

*Primary Examiner*—James B. Mullins
*Attorney, Agent, or Firm*—Limbach & Limbach; H. Donald Nelson, Vincenzo D. Pitruzzella

[57] ABSTRACT

A negative impedance converter utilizes a pair of transistors in a negative feedback configuration to thereby function as a positive differential resistance. The negative impedance converter also utilizes a second pair of transistors that are coupled in a positive feedback configuration to function as a negative differential resistance. By using substantially equal values of resistors in the emitter circuit of each transistor, the negative impedance converter provides both a differential output impedance which approaches infinity and a low common mode output impedance.

20 Claims, 3 Drawing Sheets

LOW VOLTAGE BIPOLAR NEGATIVE IMPEDANCE CONVERTER

BACKGROUND OF THE INVENTION

1. Field of the Invention

The present invention relates to negative impedance converters and, in particular, to a negative impedance converter that operates with a low supply voltage.

2. Description of the Prior Art

Many circuits require the use of current sources with high output impedances. One example of such a circuit is a transconductance capacitor filter where finite output impedances have an adverse effect on the filter's performance characteristics. Since many applications, especially filters, require current sources having a high bandwidth, negative impedance converters are used to lower the common mode output impedance and to raise or maintain the differential output impedance of single rage transconductors.

Referring to FIG. 1, a prior art bipolar negative impedance converter 10 is shown. In the converter 10 a resistor 12 and a resistor 14 together with diode connected NPN transistors 16 and 18, respectively, operate as positive resistances. A resistor 20 and a resistor 22 together with NPN transistors 24 and 26, respectively, operate as positive feedback which can be modeled as a negative differential resistance.

Although the negative impedance converter 10 provides at an $I_{OUT+}$ port 28 and an $I_{OUT-}$ port 30 a relatively low common mode output impedance together with a higher differential output impedance, the converter 10 does not perform well with a supply voltage VCC of 3 volts plus or minus 10 per cent. In FIG. 1, certain D.C. operating points are shown for no input signal and with a supply voltage of 2.70 volts. In particular, the potential at the emitter of the transistor 18 is 1.75 volts while the potentials at the base and emitter of the transistor 26 are 0.95 volt and 0.15 volt, respectively. With the converter 10 as configured, there is only a maximum of 150 millivolts for the input signal to utilize.

In further detail, assuming a base-to-emitter voltage of 0.8 volts, the path from the VCC to ground through the resistor 14, transistors 18, 44 and 24 and resistor 20 form a Kirchoff voltage loop. Thus, $VCC-(3\times0.8)-IR_{14}-IR_{20}=0$. With $VCC=2.7$ volts, $2.7-2.42-2I(R_{14}+R_{20})=0$. Thus, $I(R_{14}-R_{20})=300$ millivolts. Assuming equal values of $R_{14}$ and $R_{20}$, $IR=150$ millivolts. A pair of input DC current sources 34 and 38 route some DC bias current through the resistors 12 and 14. Thus, the minimum input DC bias current possible before clipping will produce a voltage drop across the resistor 12 and the resistor 14 of equal magnitude to the peak of the input signal swing. This cuts the 150 millivolt of input signal swing possibly down to 100 millivolts. In addition, in order to achieve a reasonable level of harmonic distortion, a greater amount of DC bias current is required by the input current circuitry.

The non-inverting input current circuitry consists of a non-inverting small signal A.C. current source 32 in parallel with the D.C. current source 34. One side of this parallel combination is connected to common, while the other side is connected to the junction of the resistor 12 and the commonly-connected base and collector nodes of transistor 16. The input inverting current circuitry further consists of an inverting small signal A.C. current source 36 in parallel with the current D.C. source 38. One side of this parallel combination is connected to common, while the other side is connected to the junction of the resistor 14 and commonly-connected base and collector nodes of transistor 18. Consequently, the input signal swing for this circuit is much less than desired. An NPN transistor 40 has its base connected to the $I_{OUT+}$ port 28 and its emitter commonly-connected to a current source 42 and to the base of the transistor 26. An NPN transistor 44 has its base connected to the $I_{OUT-}$ port 30 and its emitter commonly-connected to a current source 46 and the base of the transistor 24. Assuming equal values of $\beta$, the transistors 40 and 44, biased by the current sources 42 and 46, respectively, raise the input impedance of transistors 24, and 26 by a tactor of $\beta$, where $\beta$ is equal to the forward current gain of each of the transistors 40 and 44.

It is therefore desirable to provide a circuit that will operate with a greater level of input signal swing when using a low supply voltage.

SUMMARY OF THE INVENTION

The preferred embodiment of the invention is directed to a bipolar negative impedance converter that utilizes a pair of transistors in a negative feedback configuration such that the pair respond as a positive differential resistance. The negative impedance converter of the present invention further utilizes a second pair of transistors that are coupled in a positive feedback configuration and function as a negative differential resistance. As a result, by setting the resistances in the emitter circuit of each of the transistors to substantially equal values, the differential output impedance of the converter approaches infinity while the common mode output impedance remains low. The circuit of the present invention, because of its configuration, provides a higher ratio of permissible input signal swing to supply voltage than prior art circuits.

The above features and advantages of the present invention will become apparent from the following description and the appended claims taken in conjunction with the accompanying drawing in which like parts or elements are denoted by like reference numerals.

DETAILED DESCRIPTION OF THE INVENTION

Figure 1:
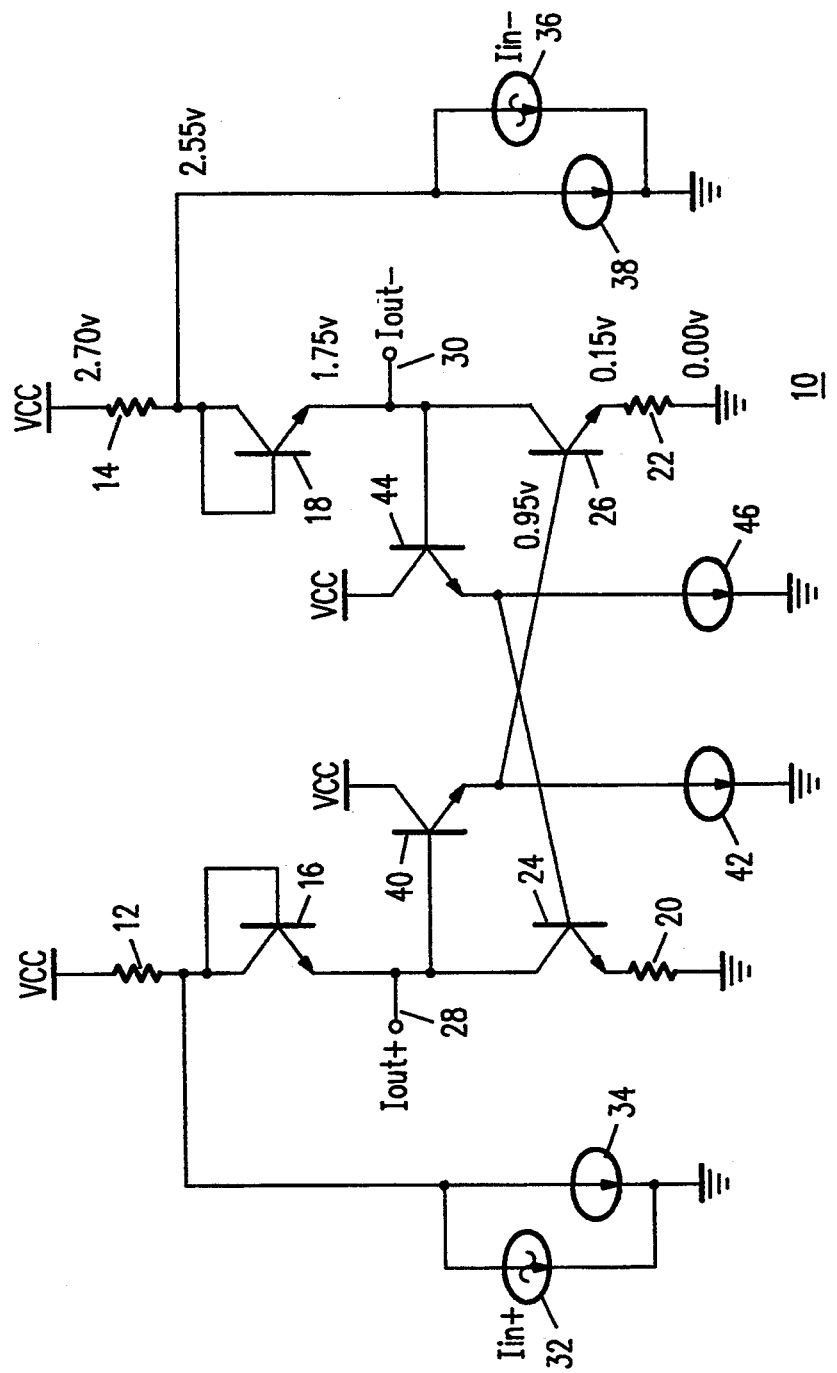
FIG. 1 is a schematic diagram illustrating a prior art bipolar negative impedance converter.
Figure 2:
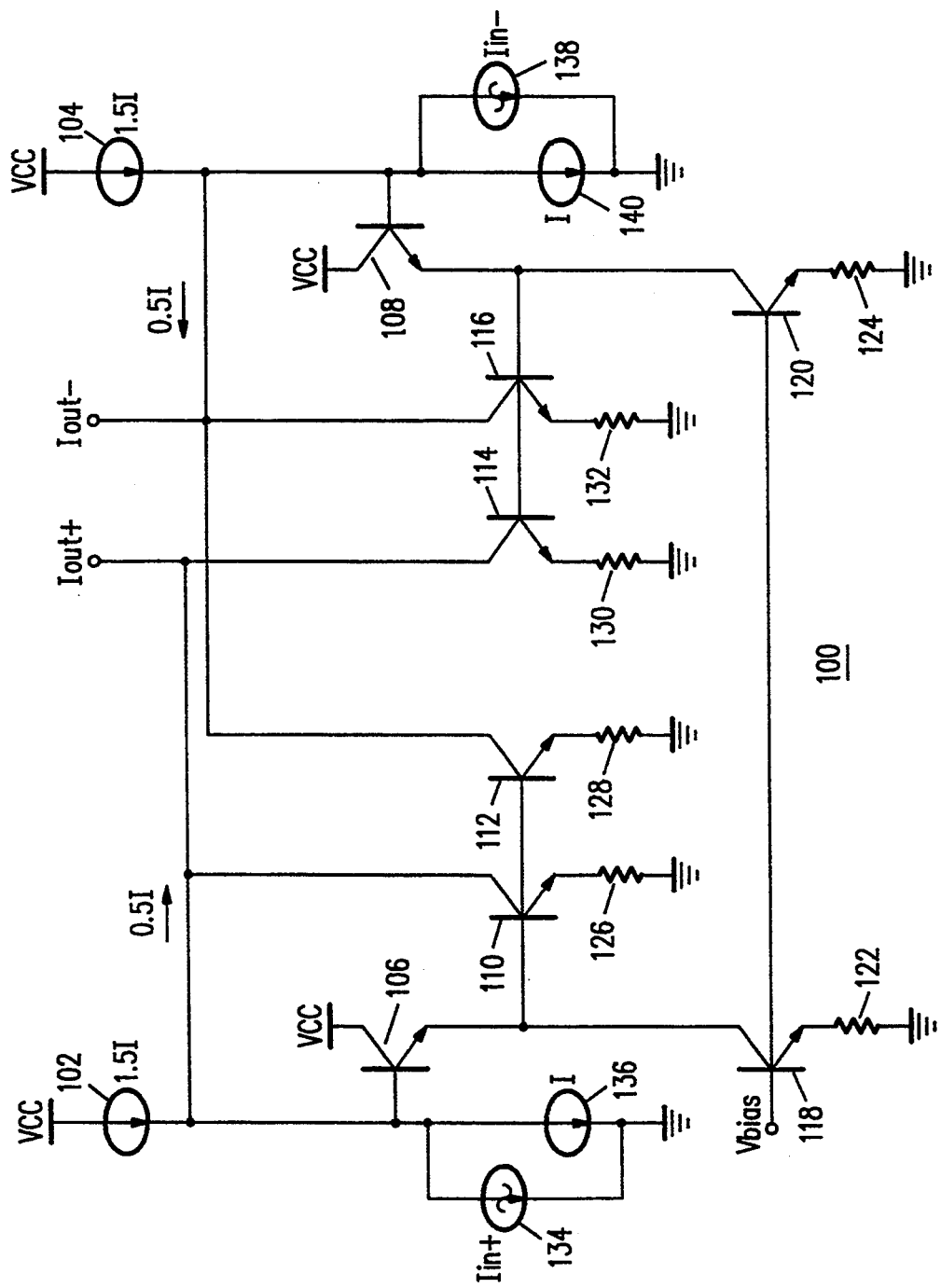
FIG. 2 is a schematic diagram illustrating a first embodiment of a low voltage bipolar negative impedance converter in accordance with the present invention.

Referring now to FIG. 2, a first embodiment of a low voltage bipolar negative impedance converter 100 is shown. The converter 100 includes a first current source 102 and a second current source 104. As is known in the art, each of these current sources 102 and 104 may consist of a PNP transistor. The amount of current flowing through each such transistor can be set by selecting the voltage at the base of each transistor.

The negative impedance converter 100 also includes a set of NPN transistors 106, 108, 110, 112, 114 and 116, the functions of which are described in greater detail below.

NPN transistors 118 and 120 have their bases connected together to a bias potential $V_{bias}$. The emitter of transistor 118 is connected to common through a resistor 122. Similarly, the emitter of transistor 120 is connected to common through a resistor 124.

The emitter of transistor 110 is connected to common through a resistor 126. Similarly, the emitter of each of transistors 112, 114 and 116 is connected to common through resistors 128, 130 and 132 respectively.

A positive signal current source 134 is connected between common and the junction of the base of transistor 106, a current source 136, the current source 102, and the collectors of transistors 110 and 114.

Similarly, a negative signal current source 138 is connected between common and the junction of the base of transistor 108, a current source 140, the current source 104, the collector of transistors 112 and 116.

The current sources 102 and 104, the collector of transistor 106 and the collector of transistor 108 are all connected to a voltage supply (not shown) having a potential of VCC.

In the operation of the FIG. 2 negative impedance converter 100, a differential signal drives the base of transistor 106 and the base of transistor 108. Each of transistor 106 and 108 operates as an emitter follower to thereby provide a differential voltage. In particular, the transistor 106 provides this differential voltage both to the base of transistor 110 and to the base of transistor 112. Similarly, transistor 108 provides a differential voltage both to the base of transistor 116 and to the base of transistor 114. In response, a current flows through the collector of each of transistors 110, 112, 114 and 116 and a much smaller amount of current flows through transistors 106 and 108.

Since the + polarity of the differential signal drives transistor 110, and the − polarity of the differential signal drives transistor 114, and given that these signals are equal and opposite, and since the collectors of transistors 110 and 114 are connected together, the currents through these collectors will be equal and opposite and thereby cancel each other.

Similarly, since the + polarity of the differential signal drives transistor 112, and the − polarity of the differential signal drives transistor 116, and given that these signals are equal and opposite, and since the collectors of the transistors 112 and 116 are connected together, the currents through these collectors will be equal and opposite and thereby cancel each other. Thus, differential signals are cancelled.

In contrast, for common mode signals, such signals will be of the same phase and potential to drive the base of each of transistors 106 and 108. With such a signal applied to the base of each of transistors 110 and 114, these transistors basically operate in parallel and the currents through their respective collectors do not cancel, but instead are summed.

Similarly, with a common mode signal applied to the base of each of the transistors 112 and 116, these transistors basically operate in parallel and the currents through their respective collections do not cancel, but instead are summed.

Thus, for common mode signals a low output impedance is presented, while for differential signals a very large output impedance is presented.

As shown in FIG. 2, transistors 110 and 116 are connected in a negative feedback configuration. This negative feedback configuration allows the transistors 110 and 116 to operate as a positive differential resistance having a value of:

$$(1/gm_{110}+R_{126})+(1/gm_{116}+R_{132}),$$

where $gm_{110}$ is the transconductance in mhos of transistor 10, $R_{126}$ is the value, in ohms, of resistor 110, $gm_{116}$ is transconductance in mhos of transistor 116, and $R_{132}$ is the value, in ohms, of resistor 132.

As further shown in FIG. 2, transistors 112 and 114 are connected in a positive feedback configuration. This positive feedback configuration allows transistors 112 and 114 to operate as a negative differential resistance having a value of:

$$-(1/gm_{112}+R_{128})-(1/gm_{114}+R_{130}),$$

where $gm_{112}$ is the transconductance in mhos of transistor 112, $R_{128}$ is the value in ohms of resistor 128, $gm_{114}$ is the transconductance in mhos of transistor 114, and $R_{130}$ is the value in ohms of resistor 130.

With the values of resistors 126, 128, 130 and 132 equal, if transistors 110, 112, 114 and 116 operated as ideal components, the output differential impedance would be infinite.

In the above-described preferred embodiment of the invention, using actual transistors, the low voltage negative impedance converter 100 provides a very high output differential impedance. Most non-idealities of transistors 110 and 116, such as a reduction of collector current due to a base current, are compensated by the non-idealities of transistors 112 and 114. Transistors 106 and 108 also compensate for such non-idealities by reducing the error due to base currents in transistors 110, 112, 114 and 116.

In further detail, the signal swing of the converter 100 is derived in the following manner. Assuming that the current sources 102 and 104 each consist of a PNP transistor-resistor circuit where the value of the emitter degeneration is equal to Y volts and the value of β for each PNP transistor is substantially equal, and the collector of each PNP transistor is allowed to go 500 millivolts above the potential at the base at such PNP transistor before non-linearities become significant, the highest voltage appearing at the base of each of transistors 106 and 108 is equal to VCC−0.8−Y+0.5.

With VCC=2.7 volts, assuming Y=200 millivolts, the highest voltage appearing at the base of each of the transistors 106 and 108 is equal to $$2.7-0.8-0.2+0.5=2.2 \text{ volts.}$$

The lowest voltage that the inputs can accommodate is:

$$0.8 \text{ volts}+0.8 \text{ volts}+X,$$

where X is equal to the lowest desired voltage across resistors 126, 128, 130 and 132. If X=200 millivolts, the lowest voltage that the inputs can accommodate is 1.8 volts. Thus, with VCC=2.7 volts the maximum differential signal swing, with good linearity, is equal to 800 millivolts.

Figure 3:
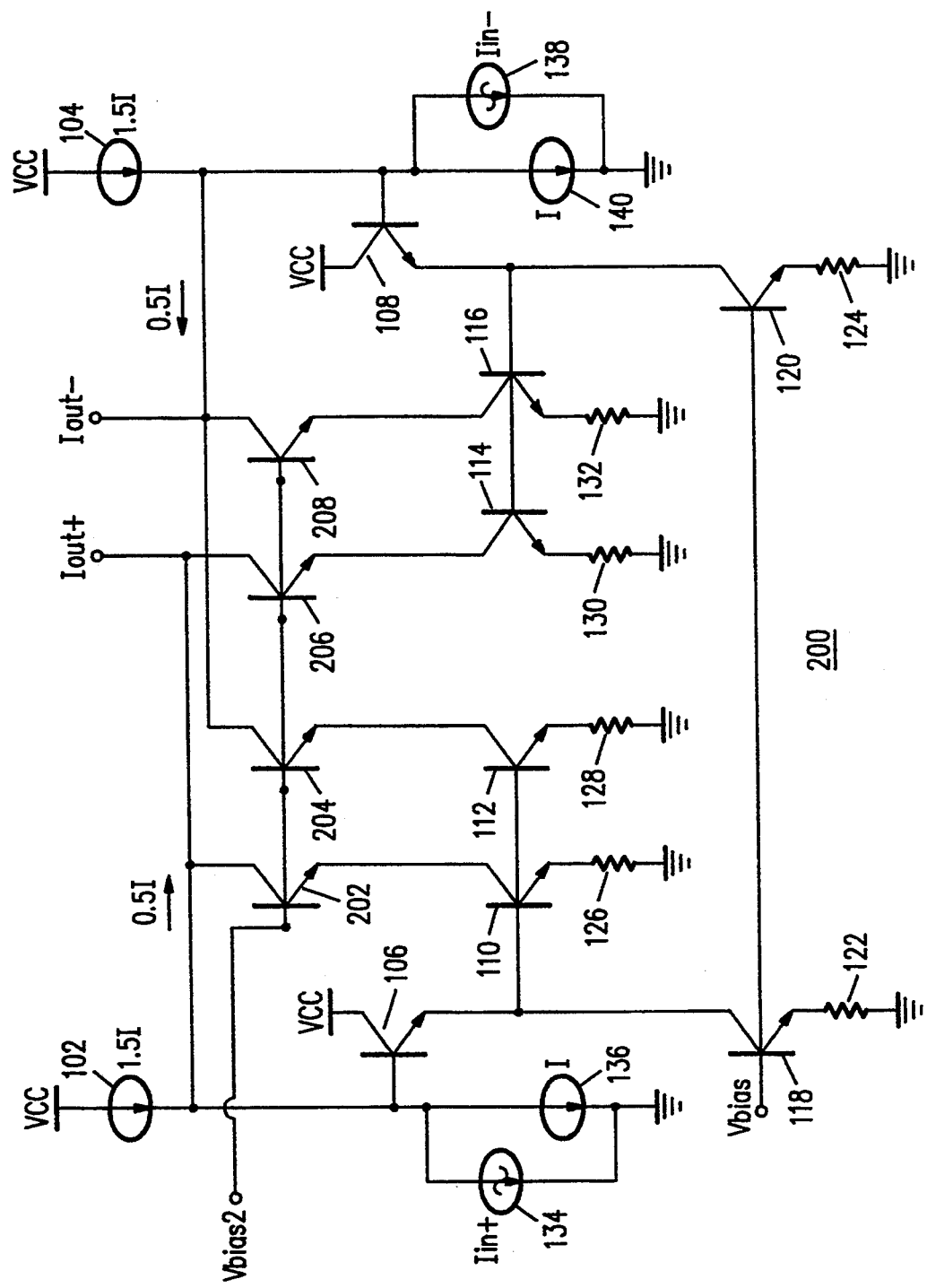
FIG. 3 is a schematic diagram illustrating a second embodiment of the low voltage bipolar negative impedance converter in accordance with the present invention.

Referring now to FIG. 3, a second embodiment of a low voltage bipolar negative impedance converter 200 is shown.

The circuit of FIG. 3 is the same as that of FIG. 2 with the addition of a set of NPN transistors 202, 204, 206 and 208, each cascoded with transistors 110, 112, 114 and 116, respectively. The use of this cascode arrangement provides a lower common mode output impedance than provided by the FIG. 2 embodiment 100.

As shown in FIG. 3, the base of each of transistors 202, 204, 206 and 208 is connected in common to an external bias labelled $V_{bias2}$. The value of the potential of $V_{bias2}$ is best set at the common mode level of the input since the collector of each transistor can go 500 millivolts below its base before non-linearities become significant. This allows up to 2000 millivolts of signal across the cascoded transistors. Thus the cascode arrangement will not limit the maximum signal swing.

While only certain preferred embodiments have been described in detail, as will be apparent to those familiar with the art, certain changes and/or modification can be made without departing from the scope of the invention as defined by the following claims.

I claim:

1. A negative impedance converter circuit having a high differential output impedance and a low common mode output impedance, the circuit comprising:
    a first pair of transistors, each of the transistors including a collector, base and emitter, the bases of both transistors connected in common;
    a second pair of transistors, each of the transistors including a collector, base and emitter, the bases of both transistors connected in common;
    a first emitter follower transistor connected to provide a first input drive signal to the bases of the first pair of transistors;
    a second emitter follower transistor connected to provide a second input drive signal to the bases of the second pair of transistors;
    a first output node connected to the collectors of a first transistor of the first pair of transistors and a first transistor of the second pair of transistors and to a base of the first emitter follower transistor; and
    a second output node connected to the collectors of a second transistor of the first pair of transistors and a second transistor of the second pair of transistors and to a base of the second emitter follower transistor, whereby differential input signals produce substantially equal and opposite currents through the collectors connected to the first output node, and substantially equal and opposite currents through the collectors connected to the second output node.

2. The negative impedance converter circuit of claim 1, further comprising:
    a first current source connected to a junction of the first emitter follower transistor and the bases of the first pair of transistors; and
    a second current source connected to a junction of the second emitter follower transistor and the bases of the second pair of transistors.

3. The negative impedance converter circuit of claim 2, further comprising:
    a first resistor connecting the emitter of the first transistor of the first pair of transistors to ground;
    a second resistor connecting the emitter of the second transistor of the first pair of transistors to ground;
    a third resistor connecting the emitter of the first transistor of the second pair of transistors to ground; and
    a fourth resistor connecting the emitter of the second transistor of the second pair of transistors to ground.

4. The negative impedance converter circuit of claim 1, further comprising:
    a first pair of current sources connected to the collector of the first transistor of each of the first and second pairs of transistors: and
    a second pair of current sources connected to the collector of the second transistor of each of the first and second pairs of transistors.

5. The negative impedance converter circuit of claim 4, further comprising:
    a first resistor connecting the emitter of the first transistor of the first pair of transistors to ground;
    a second resistor connecting the emitter of the second transistor of the first pair of transistors to ground;
    a third resistor connecting the emitter of the first transistor of the second pair of transistors to ground; and
    a fourth resistor connecting the emitter of the second transistor of the second pair of transistors to ground.

6. The negative impedance converter circuit of claim 1, further comprising:
    a first resistor connecting the emitter of the first transistor of the first pair of transistors to ground;
    a second resistor connecting the emitter of the second transistor of the first pair of transistors to ground;
    a third resistor connecting the emitter of the first transistor of the second pair of transistors to ground; and
    a fourth resistor connecting the emitter of the second transistor of the second pair of transistors to ground.

7. A negative impedance converter circuit having a high differential output impedance and a low common mode output impedance, the circuit comprising:
    a first pair of transistors, each of the transistors including a collector, base and emitter, the bases of both transistors connected in common;
    a second pair of transistors, each of the transistors including a collector, base and emitter, the bases of both transistors connected in common;
    a first emitter follower transistor connected to provide a first input drive signal to the bases of the first pair of transistors;
    a second emitter follower transistor connected to provide a second input drive signal to the bases of the second pair of transistors;
    a first output node connected to the collectors of a first transistor of the first pair of transistors and a first transistor of the second pair of transistors and to a base of the first emitter follower transistor;
    a second output node connected to the collectors of a second transistor of the first pair of transistors and a second transistor of the second pair of transistors and to a base of the second emitter follower transistor;
    a first current source connected to a junction of the first emitter follower transistor and the bases of the first pair of transistors;
    a second current source connected to a junction of the second emitter follower transistor and the bases of the second pair of transistors;

a first pair of current sources connected to a base of the first emitter follower; and a second pair of current sources connected to a base of the second emitter follower, whereby differential input signals produce substantially equal and opposite currents through the collectors connected to the first output node, and substantially equal and opposite currents through the collectors connected to the second output node.

8. The negative impedance converter circuit of claim 7, further comprising:

a first resistor connecting the emitter of the first transistor of the first pair of transistors to ground;

a second resistor connecting the emitter of the second transistor of the first pair of transistors to ground;

a third resistor connecting the emitter of the first transistor of the second pair of transistors to ground; and a fourth resistor connecting the emitter of the second transistor of the second pair of transistors to ground.

9. A negative impedance converter circuit having a high differential output impedance and a low common mode output impedance, the circuit comprising:

a first pair of transistors, each of the transistors including a collector, base and emitter, the bases of both transistors connected in common;

a second pair of transistors, each of the transistors including a collector, base and emitter, the bases of both transistors connected in common;

a first emitter follower transistor connected to provide a first input drive signal to the bases of the first pair of transistors;

a second emitter follower transistor connected to provide a second input drive signal to the bases of the second pair of transistors;

a first cascode transistor having a collector, base and emitter, the emitter of the first cascode transistor connected to the collector of a first transistor of the first pair of transistors;

a second cascode transistor having a collector, base and emitter, the emitter of the second cascode transistor connected to the collector of a first transistor of the second pair of transistors;

a third cascode transistor having a collector, base and emitter, the emitter of the third cascode transistor connected to the collector of a second transistor of the first pair of transistors;

a fourth cascode transistor having a collector, base and emitter, the emitter of the fourth cascode transistor connected to the collector of a second transistor of the second pair of transistors;

a first output node connected to the collectors of the first and second cascode transistors and to a base of the first emitter follower transistor; and a second output node connected to the collectors of the third and fourth cascode transistors and to a base of the second emitter follower transistor, whereby differential input signals produce substantially equal and opposite currents through the collectors connected to the first output node, and substantially equal and opposite currents through the collectors connected to the second output node.

10. The negative impedance converter circuit of claim 9, further comprising:

a first current source connected to a junction of an emitter of the first emitter follower transistor and the bases of the first pair of transistors; and a second current source connected to a junction of art emitter of the second emitter follower transistor and the bases of the second pair of transistors.

11. The negative impedance converter circuit of claim 10, further comprising:

a first resistor connecting the emitter of the first transistor of the first pair of transistors to ground;

a second resistor connecting the emitter of the second transistor of the first pair of transistors to ground;

a third resistor connecting the emitter of the first transistor of the second pair of transistors to ground; and a fourth resistor connecting the emitter of the second transistor of the second pair of transistors to ground.

12. The negative impedance converter circuit of claim 10, further comprising:

a voltage source connected to the base of each of the first, second, third and fourth cascode transistors.

13. The negative impedance converter circuit of claim 9, further comprising:

a first current pair of current sources connected to the
collector of each of the first and second cascode transistors; and a second current pair of current sources connected to the collector of each of the third and fourth cascode transistors.

14. The negative impedance converter circuit of claim 13, further comprising;

a first resistor connecting the emitter of the first transistor of the first pair of transistors to ground;

a second resistor connecting the emitter of the second transistor of the first pair of transistors to ground;

a third resistor connecting the emitter of the first transistor of the second pair of transistors to ground; and a fourth resistor connecting the emitter of the second transistor of the second pair of transistors to ground.

15. The negative impedance converter circuit of claim 13, further comprising:

a voltage source connected to the base of each of the first, second, third and fourth cascode transistors.

16. The negative impedance converter of claim 9, further comprising:

a first resistor connecting the emitter of the first transistor of the first pair of transistors to ground;

a second resistor connecting the emitter of the second transistor of the first of transistors to ground;

a third resistor connecting the emitter of the first transistor of the second pair of transistors to ground; and a fourth resistor connecting the emitter of the second transistor of the second pair of transistors to ground.

17. The negative impedance converter circuit of claim 9, further comprising:

a voltage source connected the base of each of the first, second, third and fourth cascode transistors.

18. A negative impedance converter circuit having a high differential output impedance and a low common mode output impedance, the circuit comprising:

a first pair of transistors, each of the transistors including a collector, base and emitter, the bases of both transistors connected in common;

a second pair of transistors, each of the transistors including a collector, base and emitter, the bases of both transistors connected in common:

a first emitter follower transistor connected to provide a first input drive signal to the bases of the first pair of transistors;

a second emitter follower transistor connected to provide a second input drive signal to the bases of the second pair of transistors with a second input signal;

a first cascode transistor having a collector, base and emitter, the emitter of the first cascode transistor connected to the collector of a first transistor of the first pair of transistors;

a second cascode transistor having a collector, base and emitter, the emitter of the second cascode transistor connected to the collector of a first transistor of the second pair of transistors;

a third cascode transistor having a collector, base and emitter, the emitter of the third cascode transistor connected to the collector of a second transistor of the first pair of transistors;

a fourth cascode transistor having a collector, base and emitter, the emitter of the forth cascode transistor connected to the collector of a second transistor of the second pair of transistors;

a first output node connected to the collectors of the first and second cascode transistors and to a base of the first emitter follower transistor;

a second output node connected to the collectors of the third and fourth cascode transistors and to a base second emitter follower transistor;

a first current source connected to a junction of art emitter of the first emitter follower and the bases of the first pair of transistors; and a second current source connected to a junction of art emitter of the second emitter follower and the bases of the second pair of transistors;

a first pair of current sources connected to the base of the first emitter follower; and a second pair of current sources connected to the base of the second emitter follower, whereby differential input signals produce substantially equal and opposite currents through the collectors connected to the first output node, and substantially equal and opposite currents through the collectors connected to the second output node.

19. The negative impedance converter circuit of claim 18, further comprising:

a first resistor connecting the emitter of the first transistor of the first pair of transistors to ground;

a second resistor connecting the emitter of the second transistor of the first pair of transistors to ground;

a third resistor connecting the emitter of the first transistor of the second pair of transistors to ground; and a fourth resistor connecting the emitter of the second transistor of the second pair of transistors to ground.

20. The negative impedance converter circuit of claim 18, further comprising:

a voltage source connected the base of each of the first, second, third and fourth cascode transistors.

* * * * *

UNITED STATES PATENT AND TRADEMARK OFFICE
CERTIFICATE OF CORRECTION

PATENT NO. : 5,392,002
DATED : February 21, 1995
INVENTOR(S) : Cary Loren Delano It is certified that error appears in the above-indentified patent and that said Letters Patent is hereby corrected as shown below:

IN THE CLAIMS:

In Col. 8, line 4, please delete "art" and replace with --an--.

In Col. 8, line 54, please insert --pair-- after "first".

In Col. 9, line 29, please delete "forth" and replace with --fourth--.

In Col. 10, line 3, please insert the words --of the-- after "base".

In Col. 10, line 4 and line 7, please delete "art" and replace with --an--.

Signed and Sealed this

Twenty-fifth Day of April, 1995

Attest:

BRUCE LEHMAN

*Attesting Officer*  *Commissioner of Patents and Trademarks*